(12) United States Patent
Göttert et al.

(10) Patent No.: US 6,482,553 B1
(45) Date of Patent: Nov. 19, 2002

(54) GRAPHITE MASK FOR X-RAY OR DEEP X-RAY LITHOGRAPHY

(75) Inventors: Jost S. Göttert, Baton Rouge; Philip J. Coane, Ruston; Kevin W. Kelly, Baton Rouge, all of LA (US)

(73) Assignee: Board of Supervisors of Louisiana State University and Agricultural and Mechanical College, Baton Rouge, LA (US)

( * ) Notice: Subject to any disclaimer, the term of this patent is extended or adjusted under 35 U.S.C. 154(b) by 67 days.

(21) Appl. No.: 09/603,512

(22) Filed: Jun. 26, 2000

Related U.S. Application Data

(60) Provisional application No. 60/141,365, filed on Jun. 28, 1999.

(51) Int. Cl.$^7$ .............................. G03F 9/00; G21K 5/00
(52) U.S. Cl. ................................ 430/5; 378/35; 378/34
(58) Field of Search ..................... 430/5, 322; 378/34, 378/35; 250/492.2

(56) References Cited

U.S. PATENT DOCUMENTS 6,178,221 B1 * 1/2001 Levinson et al. .............. 430/5

OTHER PUBLICATIONS

Coane, P. et al., "Fabrication of composite X–ray masks by micromilling," *SPIE Proceedings*, vol. 2880, pp. 130–141 (1996).
Coane, P. et al., "Fabrication of HARM structures by deep–X–ray lithography using graphite mask technology," *Microsystem Technologies*, vol. 6, pp. 94–98 (200).
Friedrich, C. et al., "Metrology and quantification of microlilled x–ray masks and exposures," *SPIE Proceddings*, vol. 3048, pp. 193–197 (1997).
Friedrich, C. et al., "Micromilling development and applications for microfabrication,"*Microelectronic Engineering*, vol. 35, pp. 367–372 (1997).
Göttert, J. et al., "Lithographic Fabrication of Graphite–based X–ray Maska," Paper presented at 42nd Electron Ion and Photon Beam Technology and Nanofabrication Conference, Chicago, IL (1998).
Harris, C. et al., "Inexpensive and Rapid x–ray Mask for LIGA," *J. Microsyst. & Tech.*, in press (1999).
Kelly, K., "Applications and Mass Production of High Aspect Ratio Microstructures Progress Report," progress report submitted to ARPA/ESTO for the period Jul. 1998–Jan. 1999.
http://web–ext2.darpa.mil/eto/MEMS/Projects/individual 38.html (1999).

* cited by examiner

*Primary Examiner*—S. Rosasco
(74) *Attorney, Agent, or Firm*—John H. Runnels

(57) ABSTRACT

A method is disclosed for producing x-ray masks on graphite substrates inexpensively and rapidly. The method eliminates the need for an intermediate x-ray mask, instead using a less expensive intermediate UV lithography step. The absorber structures are electroplated directly onto the graphite. The capability to economically produce x-ray masks is expected to greatly enhance the commercial appeal of x-ray lithography in processes such as LIGA. The x-ray mask produced by this process comprises a graphite substrate that supports an absorber such as gold-on-nickel. The thickness of the absorber structures can be varied as needed to supply sufficient contrast for the particular application. A layer of a deep UV resist such as SU-8 is spin-coated directly onto a graphite substrate. The resist is then patterned with an UV mask using a UV radiation source. After developing the exposed resist, gold-on-nickel or other absorber structures are electroplated directly into the resist-covered graphite, and the resist is then removed.

14 Claims, 1 Drawing Sheet

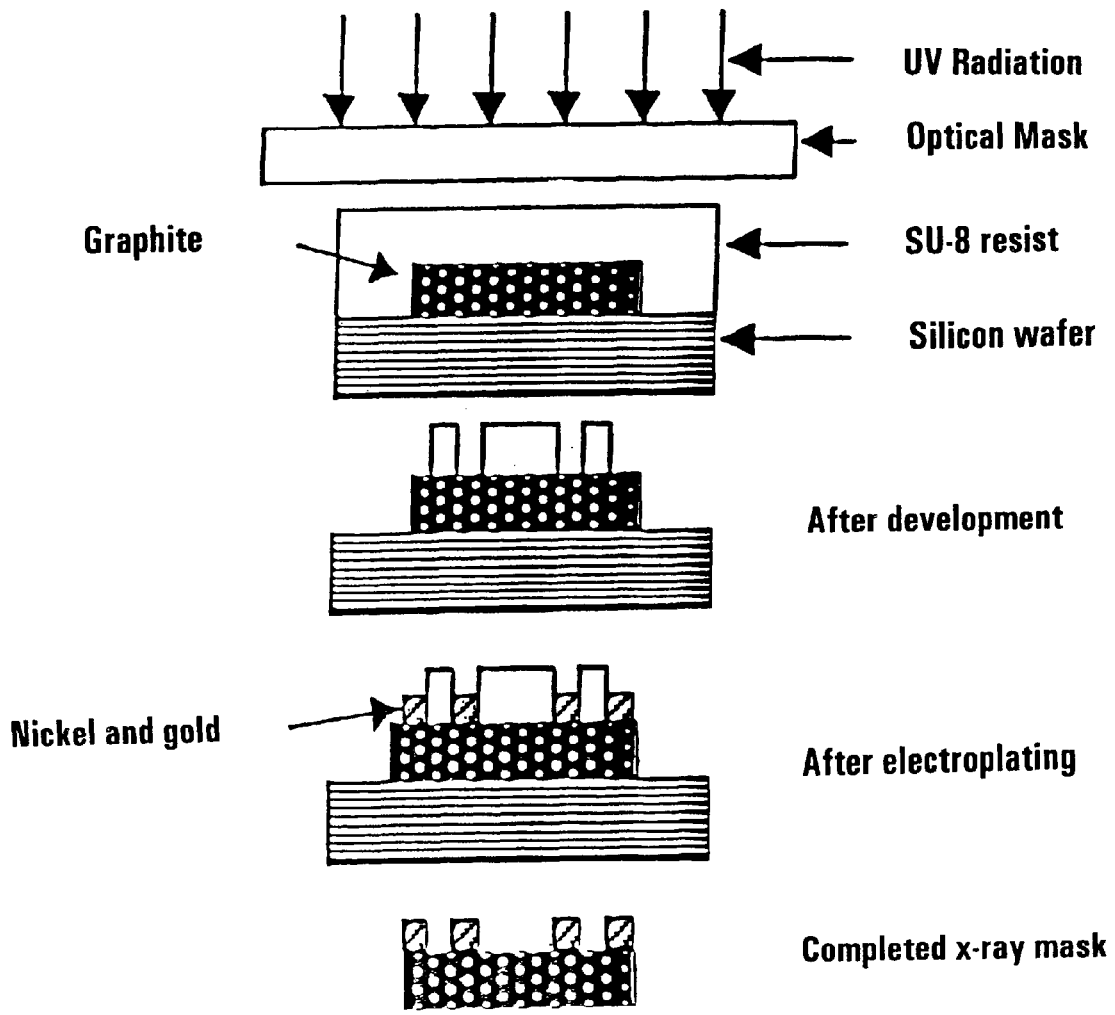
FIGURE

GRAPHITE MASK FOR X-RAY OR DEEP X-RAY LITHOGRAPHY

The benefit of the Jun. 28, 1999 filing date of provisional application No. 60/141,365 is claimed under 35 U.S.C. §119(e).

The development of this invention was partially funded by the Government under contract number DABT63-95-0020 awarded by the Defense Advanced Research Projects Agency. The Government has certain rights in this invention.

This invention pertains to masks for x-ray or deep x-ray lithography, particularly to masks formed on graphite membranes or other graphite substrates.

The fabrication of x-ray lithography masks is currently a lengthy and expensive process. It is the object of this invention to provide reliable x-ray or deep x-ray masks that may be produced more quickly and less expensively than has previously been possible.

Masks for deep X-Ray lithography are typically made from fragile, micrometer-thin membranes, typically formed of Si or Ti, and absorber structures 10–15 $\mu$m in height to provide sufficient contrast. The fabrication of these masks is a multi-step, lengthy, and expensive process, typically using an intermediate x-ray mask that in turn was directly patterned with an electron beam. The intermediate mask is used to copy the pattern into a thick polymethylmethacrylate ("PMMA") resist using soft x-rays. A metal (usually gold) is electroplated into the thick, patterned resist layer to form an absorber pattern of sufficient thickness to achieve adequate contrast when harder x-rays are used.

Masks for ultra-deep X-ray lithography are usually made in a simpler and less expensive way, for example using thick Si wafers as a substrate. Optical lithography is used to transfer a pattern into a thick UV resist to generate a resist pattern up to 50 $\mu$m thick, and the pattern is then filled with 30–35 $\mu$m of Au. However, the smallest structures achieved are typically $^-$10 $\mu$m, and these masks are generally suited only for hard x-ray sources.

The three main criteria for a high quality x-ray exposure are: (1) The top-to-bottom dose ratio for exposure through the thickness of the resist should be held below approximately 5 (an approximate figure whose value depends on the material used for the resist and its thickness—it is typically smaller with the thicker resist layers used in ultra-deep X-ray lithography). (2) The dose on the bottom of the resist should be at least about 3000 J/cm$^3$ (again, depending on the material of the resist—the figure given is for PMMA). (3) The contrast between the exposed regions and the unexposed regions should be such that the maximum dose underneath the absorber is about 100–150 J/cm$^3$ (a figure dependent on the material of the resist, the resist thickness, and the development procedures used).

As a consequence, to pattern thicker resists a "harder" x-ray spectrum is typically needed to effectively expose the bottom of the resist. (Harder x-rays can be used to expose thick resists relatively uniformly, while softer x-rays can overexpose the top of a thick resist before the bottom is properly exposed). A thicker absorber pattern is needed to provide sufficient contrast with harder X-rays.

Fabrication of a mask suitable for patterning 1000 $\mu$m of PMMA can take up to six months, and generally costs several thousand dollars.

Several methods have previously been used to fabricate x-ray lithography masks. The methods differ depending on the substrates used, and the processes used to generate the absorber pattern.

A general description of procedures that have typically been used previously to generate X-ray masks is the following:

(1) Electron beam lithography or an optical pattern generator is used to transfer a pattern from a drawing onto an intermediate x-ray mask or onto an optical (typically chromium) mask.

(2) In an intermediate x-ray mask, the resist is approximately 3–4 $\mu$m thick, and the Au absorber pattern is approximately 2–2.5 $\mu$m thick. This pattern is transferred using "soft" x-rays (a few keV photon energy) into a 30–100 $\mu$m thick PMMA resist applied onto either a membrane or a substrate.

(3) In case of a chromium mask, optical lithography is used to pattern a thick optical resist onto either a membrane or a substrate, typically using UV light.

(4) In either case, following exposure a wet-chemical development process is used to remove either the exposed regions (for a positive resist) or the unexposed regions (for a negative resist).

(5) The recesses produced in the previous step are then filled with an absorber by electroplating, typically with Au. A typical height for the Au absorber is about ⅔ of the resist height.

(6) The resist is removed, and the mask is mounted onto a carrier for use in x-ray lithography.

(7) In the case of a membrane-based mask, the substrate must be mounted onto a frame or carrier prior to patterning. Such mounting requires special fixtures and extreme care in handling. In the case of a substrate-based mask, the frame or carrier may be mounted after patterning the mask, allowing the use of standard fixtures (typically vacuum chucks) and only moderate attention in handling.

For prototype development work, the time and cost required to manufacture an x-ray mask using this procedure can be excessive.

A graphite-based substrate for an x-ray or deep x-ray mask would be relatively inexpensive, would have reasonably good x-ray transmission, and could be mechanically sound. Such substrates could be used in otherwise standard or ultra-deep x-ray lithography processes.

Graphite substrates have not generally been used in x-ray masks, primarily because they have been considered too "dirty" for use in the "clean room" environment used for x-ray lithographic processes. Graphite surfaces tend to be rough and porous. Silicon substrates and membranes are more familiar to most users.

J. Göttert et al., "Lithographic Fabrication of Graphite-based X-ray Masks," paper presented at 42nd Electron Ion and Photon Beam Technology and Nanofabrication Conference, Chicago, Ill. (1998) discloses a process in which graphite sheets are attached to a silicon wafer using PMMA as a bonding layer, and a metal layer consisting of a thin copper layer on top of a chromium layer is sputtered onto the graphite. Then a PMMA resist layer is spin-coated onto the sample. The sample is then exposed with x-rays through an intermediate x-ray mask, and developed to remove exposed resist and to etch the thin copper layer. Then the sample is electroplated with gold, the remaining PMMA is dissolved away, and the remaining copper is etched away.

X-ray lithography masks formed of graphite have been made by micromilling techniques, and lithographically through the use of an intermediate X-ray mask. See P. Coane et al., "Fabrication of composite X-ray masks by micromilling," *SPIE Proceedings*, vol. 2880, pp. 130–141 (1996); C. Friedrich et al., "Micromilling development and applications for microfabrication," *Microelectronic Engineering*, vol. 35, pp. 367–372 (1997); C. Friedrich et al., "Metrology and quantification of micromilled x-ray masks and exposures," *SPIE Proceedings*, vol. 3048, pp. 193–197 (1997); and P. Coane et al., "Graphite-based x-ray masks for deep and ultradeep x-ray lithography," *J. Vac. Sci. Technol. B.*, vol. 16, pp. 3618–3624 (1998).

P. Coane et al., "Fabrication of HARM structures by deep-X-ray lithography using graphite mask technology," *Microsystem Technologies*, vol. 6, pp. 94–98 (2000) (paper presented at Third International Workshop on High Aspect Ratio Microstructure Technology (June 1999)) discloses the manufacture of graphite masks in which a single graphite wafer accommodates, on opposite faces, both an intermediate mask and a working mask.

It is an object of this invention to provide a method to fabricate deep X-ray lithography and ultra-deep X-ray lithography masks reliably and inexpensively, facilitating the cost-effective production of high aspect ratio microstructures using either "hard" or soft X-ray sources.

We have discovered an improved method for producing x-ray or deep x-ray masks on graphite membranes (or thicker graphite substrates) inexpensively (under $1000) and rapidly (within about one day once an optical mask is available). The novel method eliminates the need for an intermediate x-ray mask, instead using a less expensive intermediate UV lithography step (either exposure through a UV mask, or UV direct writing). The absorber structures are electroplated directly onto the graphite. The capability to economically produce x-ray or deep x-ray masks is expected to greatly enhance the commercial appeal of x-ray lithography in processes such as LIGA. ("LIGA" is a German acronym for lithography, electroplating, and molding.)

The x-ray mask produced by this process comprises a graphite substrate that supports an absorber such as gold or gold-on-nickel. The thickness of the absorber structures can be varied as needed to supply sufficient contrast for the particular application in question, even for radiation sources with characteristic photon energies up to 40 keV or more. The thickness of the absorber structures may be from a few micrometers to 20 micrometers or more.

A layer of a deep ultraviolet resist is applied directly onto a graphite substrate, typically by spin-coating a layer 30–50 $\mu$m thick, but potentially up to 1000 $\mu$m thick, depending on the application. The ultraviolet resist is then patterned with a UV mask using a UV radiation source. After developing the exposed resist, gold-on-nickel or other absorber structures are electroplated directly into the resulting gaps in the resist-covered graphite. Once the remaining resist is removed, attaching a graphite membrane (e.g., 125 to 250 $\mu$m thick) to a frame completes the mask. If a thicker graphite substrate is used (e.g., 250 to 1000 $\mu$m thick), a separate frame support may not be needed.

The novel combination of a graphite-based substrate with deep UV resist offers a number of advantages over competing mask fabrication technologies. The use of a graphite substrate makes it possible to fabricate masks that can be used for both deep and ultra-deep X-ray lithography (depending upon the thickness of the substrate selected), leading to a reliable and standardized fabrication procedure. The combination of graphite and deep UV resists makes it possible to fabricate X-ray masks quickly, without the need for a time-consuming, costly, intermediate mask step.

Typical mask fabrication steps in the novel process, using graphite wafers and deep UV resist are as follows:

(1) Surface preparation of graphite. We have found that commercially available graphite substrates can have different surface qualities and treatments. It can therefore be useful to prepare the graphite surface prior to use by fly-cutting, polishing, or both to improve surface uniformity. In addition, it is usually preferred to seal the surface, for example by depositing a thin metal layer through otherwise conventional means (e.g., sputtering copper or chromium), in order to improve process stability.

(2) Application of the resist. A deep UV resist, for example SU-8 or SJR, is applied to the graphite, for example by spin coating a 10–60 $\mu$m thick layer, depending upon the application.

The resist is soft-baked for a suitable time and temperature, depending upon the particular resist and the size of the structures. The resist is exposed with UV in the desired pattern, and then developed. A metal absorber, typically gold, is electroplated into the pattern. The height of the absorber structures should be less than the thickness of the UV resist. The UV resist is removed, and the graphite-gold x-ray mask is mounted in a frame (if necessary or desirable for the intended application).

The x-ray mask produced by this process comprises a graphite substrate that supports an absorber such as gold. The thickness of the absorber structures can be varied from a few micrometers to 30 micrometers or more, to supply the contrast needed for a particular application, even for radiation sources with characteristic photon energies up to 40 keV or more.

As used in the specification and claims, a "deep" ultraviolet resist is an ultraviolet resist that may be effectively patterned to a depth of at least about 10 $\mu$m by exposure to ultraviolet light and development, preferably to a depth of at least about 30 $\mu$m. A preferred deep ultraviolet resist is the negative resist EPON® resin SU-8. SU-8 is a multifunctional glycidyl ether derivative of bisphenol-A novolac, available for example from Shell Chemical. SU-8 is a deep ultraviolet resist fabricated from a novolac resin, a negatively acting chemically amplified epoxy, a photosensitive initiator, and gamma butyro lactone as a solvent. SU-8 provides a high epoxy functionality. The novolac resin and epoxy, along with the initiator, form a three-dimensional, insoluble polymer upon exposure to ultraviolet light. The solvent serves to allow the resist to be applied, and is removed by pre-baking.

Another preferred deep ultraviolet resist is one of the SJR family of positive resists, such as SJR 3138, SJR 3440J, SJR 5440, SJR 3740, and SJR 5740. Particularly preferred is SJR 5740, available from Shipley Company (Marlborough, Mass.).

Examples of deep ultraviolet resists other than SU-8 and SJR 5740 include AZ PN114, a novolac-based negative resist available from Shipley Company (Marlborough, Mass.) or Hoechst; and CAMP6, a positive deep UV resist. CAMP6 is a polyhydroxystyrene-sulfone copolymer-based resist available from OCG Microelectronics Materials (West Paterson, N.J.) or Bell Laboratories (Murray Hill, N.J.). Other polyhydroxystyrene-sulfone copolymer-based resists may also be used in this invention.

The structure of the functional portion of SU-8 is

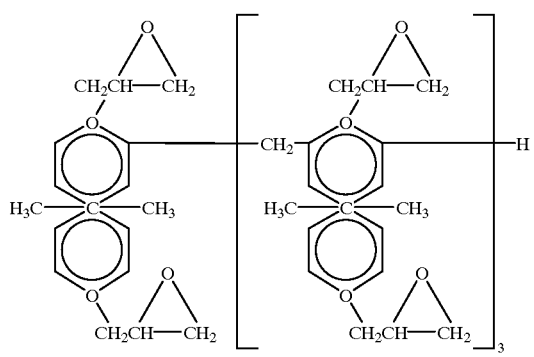

BRIEF DESCRIPTION OF THE DRAWING

The single FIGURE illustrates schematically a process for making an x-ray mask in accordance with the present invention.

The following procedures were used to produce prototype x-ray masks in accordance with the invention.

An optical (UV) lithography mask (chrome on glass) was fabricated through conventional means known in the art.

A 5 cm square graphite sample 125 μm thick was attached to a silicon wafer using spin-coated PMMA as a bonding layer. The PMMA was then dried at 150° C. for 30 minutes. The silicon wafer provided a rigid support for the graphite during processing, as well as a geometry compatible with existing processing equipment.

The graphite was cleaned for 15 seconds with acetone, isopropyl alcohol, and deionized water, and was then dried in an oven. We found that this cleaning procedure greatly improved the bonding between the graphite and the wafer, thereby improving the coverage of SU-8 on the graphite. Without this cleaning step, the SU-8 tended to recede from the edges of the graphite.

4 mL of SU-8-5 optical negative resist from MicroChem Corporation (Newton, Mass.) was spin-coated onto the graphite at 650 rpm to achieve a thickness of 30 μm. (The suffix −5 at the end of the name SU-8-5 denotes the ratio of resin to solvent; the higher the ratio, the thicker the resist, and the thicker the layer that will be spun-coated under a given set of conditions.) A two-step soft bake was performed at 65° C. for 5 minutes, then at 90° C. for 6 minutes. The lower temperature bake was just above the glass transition temperature of the resist, allowing it to flow slowly before the higher temperature bake.

The SU-8 coated graphite sample was optically exposed with the G-line (435.6 nm) of a 1000 W Hg lamp at a dose of 100 mJ/cm². A two-step post-exposure bake was performed at 50° C. for 1 minute and 90° C. for 1.5 minutes. The lower temperature bake, just below the glass transition temperature of the resist, was intended to allow some degree of stress relief in the resist.

The exposed SU-8 was developed in XP™ SU-8 developer (1-methoxy-2-propyl acetate) (MicroChem Corp., Newton, Mass.) in a three-step process. A puddle of SU-8 developer was applied over the graphite for one minute, and the sample was spun at 700 rpm for 1 minute. During the first 30 seconds of spinning, additional SU-8 developer was continuously applied. During the last 30 seconds the sample was allowed to spin dry. The spinning helped thoroughly clean out the channels in the exposed resist.

A two-step electroplating process was used to build the absorber pattern onto the graphite membrane. First, 3 μm of nickel was plated into the voids between the SU-8 structures, and then 9 μm of gold was plated onto the nickel. The electroplating parameters are shown in Table 1. The optional nickel layer provided both a good bond to the rough graphite and a smooth surface from which to initiate the gold plating. Alternatively, gold may be electroplated onto the graphite directly, without the intermediate nickel layer. The metal layer may, for example, be between about 5 and about 50 μm thick. For best results, the electroplating should be performed immediately after development, with minimal further exposure to light, to ensure maximum adhesion of the SU-8 to the substrate during the electroplating, and to minimize the deadhesion of SU-8 that we found can otherwise be promoted by temperature and humidity effects.

TABLE 1

Electroplating Parameters

| Plating | 3 μm Ni | 9 μm Au | 250 μm Ni |
|---|---|---|---|
| Bath Type | Modified | Technic Gold | Modified Watts |
| Temperature | 50 | 50 | 50 |
| pH | 2.5 | 9.1 | 2.5 |
| Mode | Galvanostatic | Galvanostatic | Galvanostatic |
| Current | 10 mA/cm³ | 1.0 mA/cm³ | 25 mA/cm³ |

The resist layer was removed using SU-8 remover (N-methyl pyrrolidinone) at 80° C. Note that, depending on the reaction conditions used, the remover may weaken the PMMA bond enough to cause the graphite to debond from the silicon wafer during this step.

The graphite was then separated from the silicon wafer by spraying acetone along the perimeter of the graphite, and peeling the graphite off the substrate. The graphite was then secured to a metal frame, completing the mask.

A prototype graphite mask made in accordance with this invention was used to fabricate a nickel mold insert. Synchrotron radiation with a characteristic energy of 1.66 keV (corresponding to 1.3 GeV electron energy at CAMD) was used to expose a 500 μm-thick sheet of PMMA bonded to a nickel substrate. A 14 μm thick aluminum absorber and the graphite membrane of the x-ray mask in tandem produced a PMMA bottom dose of 3500 J/cm³, with a top-to-bottom dose ratio of 3.5. Once exposed, the PMMA was developed using GG developer followed by a rinse. The developer was a mixture of 600 parts (by volume) 2-(2-butoxyethoxy)-ethanol, 200 parts morpholine, 50 parts 2-aminoethanol, and 150 parts water. The rinse was a mixture of 800 parts (by volume) 2-(2-butoxyethoxy)-ethanol and 200 parts water. Nickel was electroplated to a height of 250 μm into the PMMA pattern using the parameters shown in Table 1. The PMMA was removed with acetone to complete fabrication of the mold insert.

Other prototype masks have been made using SJR 5740 resist rather than SU-8.

The deep UV resist should fulfill several requirements, all of which were satisfied by the SU-8 5 and SJR 5740 resists used in the prototype experiments. The resist should adhere to the substrate throughout the lithography and electroplating processes. The dimensional tolerance for the patterned structure dimensions should be small, preferably submicrometer. The sidewalls of the resist structures should be smooth. Finally, the resist should be easily and completely removable after the electroplating of the absorber pattern onto the graphite has been completed. Similarly, the electroplated absorber structures should adhere well to the graphite, even after the mask has been used many times to pattern PMMA sheets.

Scanning electron micrographs (not shown) of a cross-sectional view of a 30 $\mu$m thick layer of SU-8 5 resist patterned on graphite to produce 200 $\mu$m wide channels showed that adhesion of the SU-8 to the graphite was good, although the SU-8 exhibited a sloped sidewall. The angle of the sidewall varied between about 75° and 85° within the sample, with the dimension at the resist-graphite interface being the same as the dimension of the UV mask. A similar sidewall angle was observed when patterning the SU-8 on a silicon wafer. The sidewall tilt can be reduced somewhat by decreasing the exposure time of the SU-8.

A nickel-gold absorber pattern was successfully electroplated into the voids of the patterned SU-8. The SU-8 was then removed to produce the x-ray mask. An electron micrograph (not shown) of an end of channel view of the absorber showed once again that adhesion was good, with the SU-8 sidewall angle producing an inverse angle in the absorber structures. We observed that the dimension of the UV mask was the same as the dimension of the electroplated structure at its interface with the graphite. The adhesion between the graphite, nickel, and gold was good, and the sidewall was smooth. An electron micrograph overview (not shown) of a few channels of the absorber pattern on the graphite revealed that the channels were very straight, and that the gold was smooth and uniform. These micrographs of the mask were taken after one deep x-ray exposure had been performed. Due to the high thermal conductivity of the graphite and its relatively low absorption of x-rays, thermal cycle fatigue is not expected to be a significant problem.

A prototype graphite x-ray mask was used to expose a 500 $\mu$m thick sheet of PMMA bonded to a nickel substrate. (Several other prototype masks of different patterns have also been made.) Once the PMMA was developed, nickel was electroplated onto the PMMA-covered substrate to produce a mold insert. The width of these structures was measured as 200.8±1.0 $\mu$m on a Nikon Measurescope.™ The small difference between this dimension and the 200 $\mu$m width of the UV mask was due to the sidewall angle of the resist. However, the sidewalls of the insert were still vertical and smooth.

It is important to note that the angled absorber sidewall did not cause the mold insert to be rough or non-vertical. The mold insert had smooth, vertical sidewalls whose dimensions were within two micrometers of the UV mask dimensions. If the dimensional tolerance of the structure is small (±1–1.5 $\mu$m), an optical mask could be produced with dimensions slightly smaller (about 1 $\mu$m) than the desired dimensions to produce a dimensional tolerance around one micrometer. This accuracy is satisfactory for a wide variety of mask geometries. However, the non-vertical sidewalls of the resist may limit the use of this method to applications where small mask dimensions or tight tolerances are not required.

The complete disclosures of all references cited in this specification are hereby incorporated by reference, as is the complete disclosure of the 35 U.S.C. §119(e) provisional priority application, and as are the complete disclosures of the following two papers, none of which is prior art to this application: C. Harris et al., "Inexpensive and Rapid X-ray Mask for LIGA," *J. Microsyst. & Tech.*, in press (1999); K. Kelly, "Applications and Mass Production of High Aspect Ratio Microstructures Progress Report," progress report submitted to ARPA/ESTO for the period July 1998–January 1999.

See also a brief summary of the latter, available on the Internet as of the 35 U.S.C. §119(e) priority date of this application at http://web-ext2.darpa.mil/eto/MEMS/Projects/individual_38.html (1999). In the event of an otherwise irreconcilable conflict, however, the present specification shall control.

We claim:

1. A method for producing a mask for x-ray or deep x-ray lithography, said method comprising the steps of:
   (a) placing a layer of a deep ultraviolet resist on a graphite substrate;
   (b) exposing the resist layer to a pattern of actinic ultraviolet radiation;
   (c) (1) developing the resist layer to selectively remove the portions of the resist layer that were not exposed to the actinic radiation, and uncovering the portions of the graphite substrate that had underlain those unexposed portions; or (2) developing the resist layer to selectively remove the portions of the resist layer that were exposed to the actinic radiation, and uncovering the portions of the graphite substrate that had underlain those exposed portions;
   (d) electroplating a layer of metal onto the uncovered portions of the graphite substrate, in the spaces where the overlying portions of the resist layer have been removed; and
   (e) removing the remaining portions of the resist, leaving the graphite substrate and the electroplated, patterned layer of metal, thereby yielding a mask suitable for use in x-ray or deep x-ray lithography.

2. A method as recited in claim 1, wherein the deep ultraviolet resist layer comprises SU-8 or SJR 5740.

3. An x-ray lithography mask produced by the method of claim 2.

4. A method as recited in claim 1, wherein the layer of metal comprises a layer of nickel adjacent the graphite substrate, and a layer of gold adjacent the nickel layer.

5. An x-ray lithography mask produced by the method of claim 4.

6. A method as recited in claim 1, where the layer of metal comprises a layer of gold.

7. An x-ray lithography mask produced by the method of claim 6.

8. A method as recited in claim 1, wherein the height of the metal layer is between about 5 $\mu$m and about 50 $\mu$m.

9. An x-ray lithography mask produced by the method of claim 8.

10. A method as recited in claim 1, wherein the thickness of the graphite substrate is between about 125 $\mu$m and about 250 $\mu$m.

11. An x-ray lithography mask produced by the method of claim 10.

12. A method as recited in claim 1, wherein the thickness of the graphite substrate is between about 250 $\mu$m and about 1000 $\mu$m.

13. An x-ray lithography mask produced by the method of claim 12.

14. An x-ray lithography mask produced by the method of claim 1.

* * * * *